(12) United States Patent
Ko et al.

(10) Patent No.: US 11,538,743 B2
(45) Date of Patent: Dec. 27, 2022

(54) MICROELECTRONIC DEVICE WITH FLOATING PADS

(71) Applicant: Texas Instruments Incorporated, Dallas, TX (US)

(72) Inventors: Chang-Yen Ko, Taipei (TW); Jk Ho, New Taipei (TW)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 114 days.

(21) Appl. No.: 17/108,920

(22) Filed: Dec. 1, 2020

(65) Prior Publication Data

US 2021/0082794 A1    Mar. 18, 2021

Related U.S. Application Data

(63) Continuation of application No. 16/273,148, filed on Feb. 12, 2019, now Pat. No. 10,854,538.

(51) Int. Cl.
*H01L 23/31* (2006.01)
*H01L 23/495* (2006.01)
(Continued)

(52) U.S. Cl.
CPC .... *H01L 23/49575* (2013.01); *H01L 21/4825* (2013.01); *H01L 23/3107* (2013.01); *H01L 23/49503* (2013.01); *H01L 23/49513* (2013.01); *H01L 23/49524* (2013.01); *H01L 23/49541* (2013.01); *H01L 23/49548* (2013.01); *H01L 23/5227* (2013.01); *H01L 23/645* (2013.01); *H01L 24/09* (2013.01); *H01L 24/32* (2013.01);
(Continued)

(58) Field of Classification Search
CPC ............. H01L 23/49513; H01L 24/33; H01L 21/4825; H01L 24/73; H01L 23/49524; H01L 24/09; H01L 23/49548; H01L 24/49; H01L 2224/73265; H01L 2224/091; H01L 23/49575; H01L 23/3107; H01L 23/49541; H01L 23/5227; H01L 23/645; H01L 24/32; H01L 23/49503
See application file for complete search history.

(56) References Cited

U.S. PATENT DOCUMENTS 7,468,547 B2   12/2008  Harvey
9,035,435 B2    5/2015  Balakrishnan et al.
(Continued)

*Primary Examiner* — Shouxiang Hu
(74) *Attorney, Agent, or Firm* — Dawn Jos; Frank D. Cimino

(57) ABSTRACT

A microelectronic device has a first die attached to a first die pad, and a second die attached to a second die pad. A magnetically permeable member is attached to a first coupler pad and a second coupler pad. A coupler component is attached to the magnetically permeable member. The first die pad, the second die pad, the first coupler pad, the second coupler pad, and the magnetically permeable member are electrically conductive. The first coupler pad is electrically isolated from the first die, from the second coupler pad, and from external leads of the microelectronic device. The second coupler pad is electrically isolated from the first die and from the external leads. The first die and the second die are electrically coupled to the coupler component. A package structure contains at least portions of the components of the microelectronic device and extends to the external leads.

15 Claims, 19 Drawing Sheets

(51) Int. Cl.
*H01L 21/48* (2006.01)
*H01L 23/00* (2006.01)
*H01L 23/522* (2006.01)
*H01L 23/64* (2006.01)

(52) U.S. Cl.
CPC .............. *H01L 24/33* (2013.01); *H01L 24/49* (2013.01); *H01L 24/73* (2013.01); *H01L 2224/091* (2013.01); *H01L 2224/73265* (2013.01)

(56) References Cited

U.S. PATENT DOCUMENTS

| | | | |
|---|---|---|---|
| 9,349,717 B2 * | 5/2016 | Kung | H01L 28/10 |
| 9,466,413 B2 | 10/2016 | Brauchler et al. | |
| 2009/0009408 A1 | 1/2009 | Rofougaran | |
| 2009/0186453 A1 | 7/2009 | Koduri | |
| 2011/0133561 A1 * | 6/2011 | Kanazawa | H01F 27/2804 |
| | | | 307/75 |
| 2015/0004902 A1 | 1/2015 | Pigott et al. | |
| 2015/0325501 A1 | 11/2015 | Sutton et al. | |
| 2017/0138988 A1 | 5/2017 | Ausserlechner | |
| 2017/0178787 A1 | 6/2017 | Massolini et al. | |
| 2017/0373008 A1 | 12/2017 | Constantino et al. | |
| 2019/0157188 A1 * | 5/2019 | Mullenix | H01L 23/49589 |

* cited by examiner

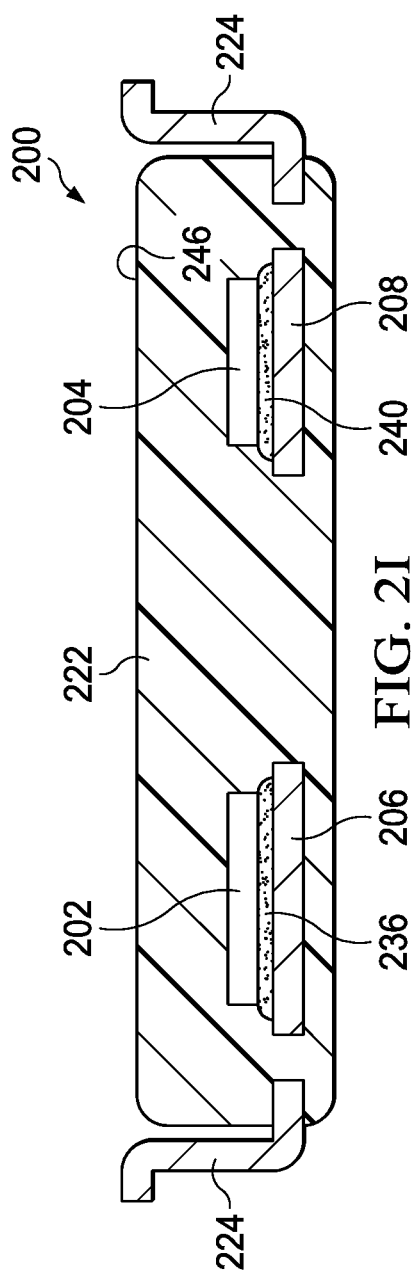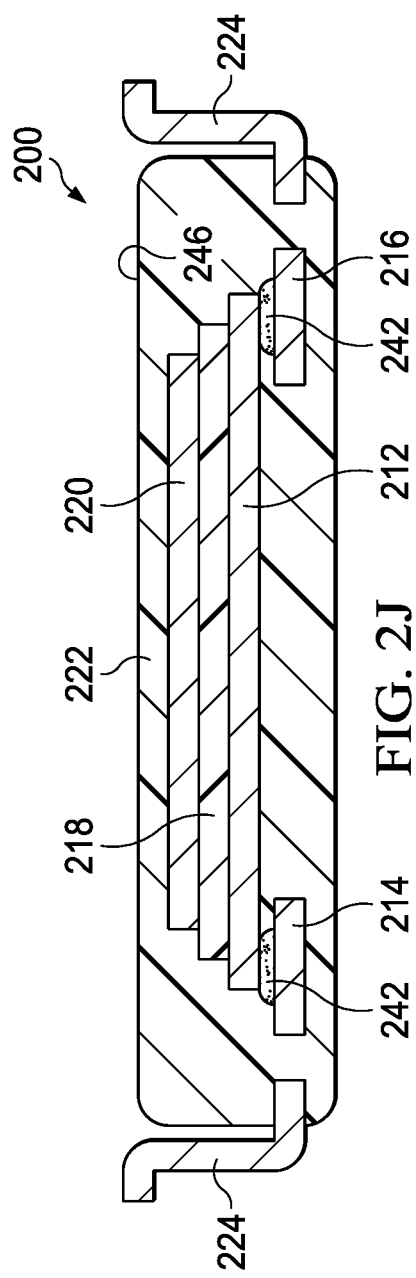

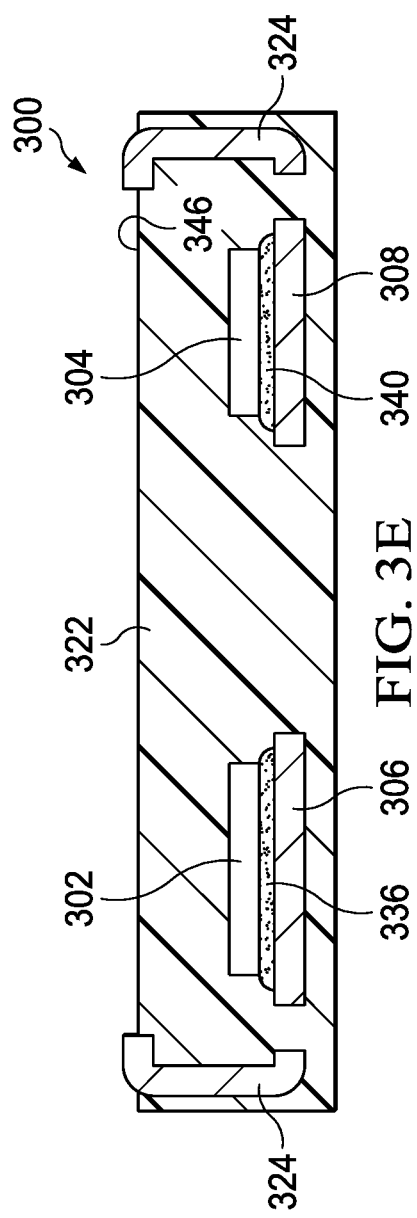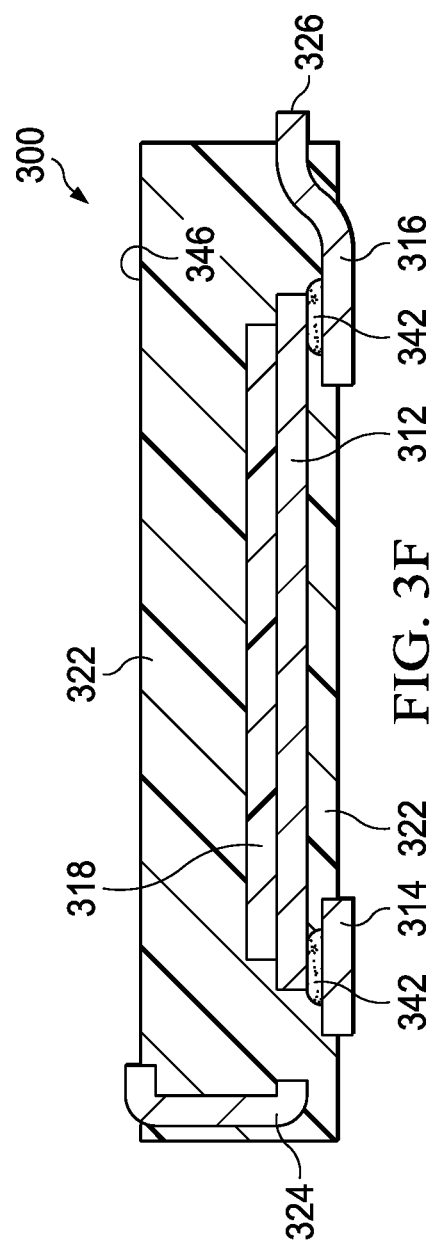

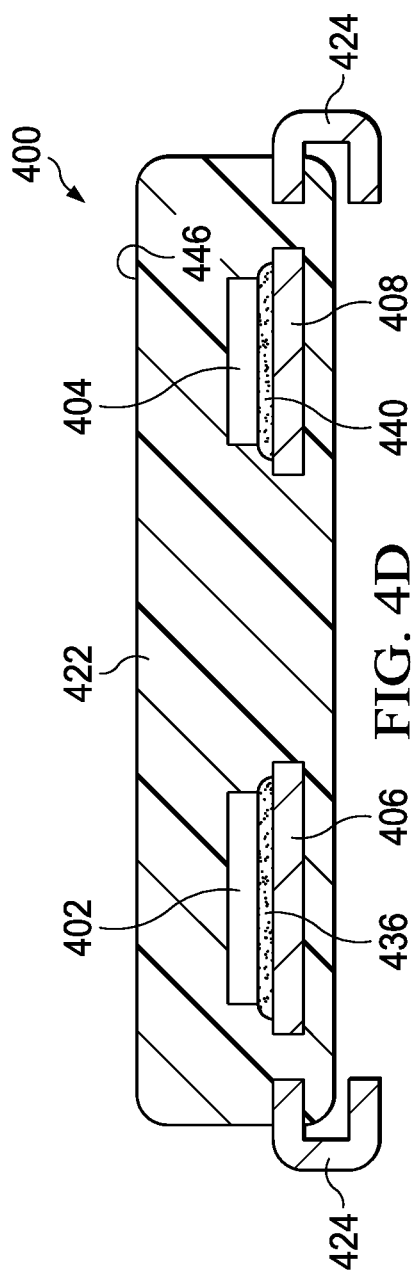
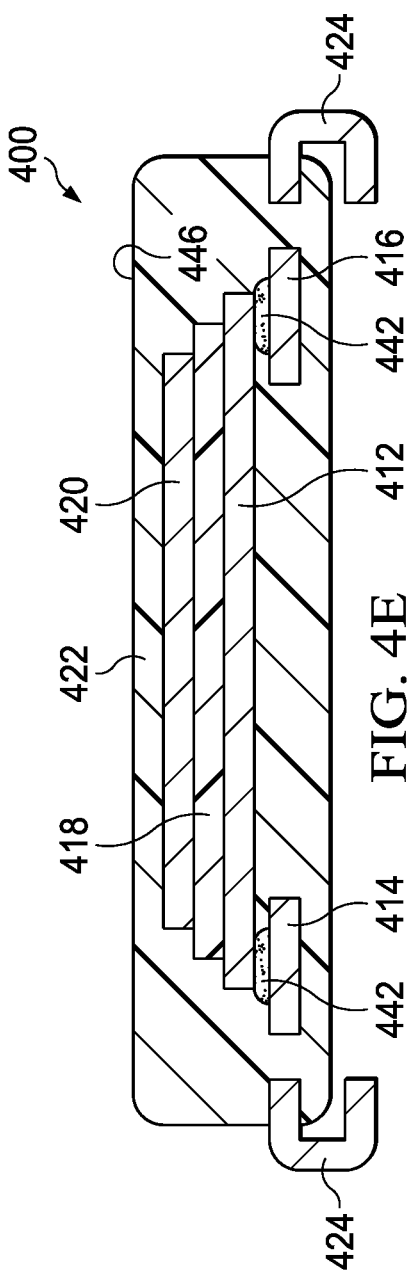

MICROELECTRONIC DEVICE WITH FLOATING PADS

MICROELECTRONIC DEVICE WITH FLOATING PADS

This application is a continuation of U.S. patent application Ser. No. 16/273,148, filed Feb. 12, 2019, the contents of all of which are herein incorporated by reference in its entirety.

FIELD

This disclosure relates to the field of microelectronic devices. More particularly, this disclosure relates to high voltage components in microelectronic devices.

BACKGROUND

Some microelectronic devices include high voltage components, which operate at potentials above 100 volts, and also include low voltage components, which operate at potentials below 10 volts. The high voltage components may be electrically coupled to the low voltage components through coupler components. Reducing leakage current through the coupler components is important for functionality and reliability of the microelectronic devices.

SUMMARY

The present disclosure introduces a microelectronic device having a first die attached to a first die pad, and a second die attached to a second die pad, and a coupler component attached to a first magnetically permeable member, the first magnetically permeable member being attached to a first coupler pad and a second coupler pad. The first die pad, the second die pad, the first coupler pad, the second coupler pad, and the first magnetically permeable member are electrically conductive. The first die is not directly electrically coupled to the second die, that is, there is no path for direct current from the first die to the second die. The first coupler pad is electrically isolated from the first die, from the second coupler pad, and from external leads of the microelectronic device. The second coupler pad is electrically isolated from the first die and from the external leads of the microelectronic device. The first die and the second die are electrically coupled to the coupler component. A package structure contains at least portions of the components of the microelectronic device and extends to the external leads. A method of forming the microelectronic device is disclosed.

BRIEF DESCRIPTION OF THE VIEWS OF THE DRAWINGS

FIG. 2A through FIG. 2J are top views and cross sections of a microelectronic device having floating pads, depicted at stages of an example method of formation.

FIG. 3A through FIG. 3F are top views and cross sections of a microelectronic device having floating pads, depicted at stages of another example method of formation.

FIG. 4A through FIG. 4E are top views and cross sections of a microelectronic device having floating pads, depicted at stages of another example method of formation.

DETAILED DESCRIPTION

Figure 1:
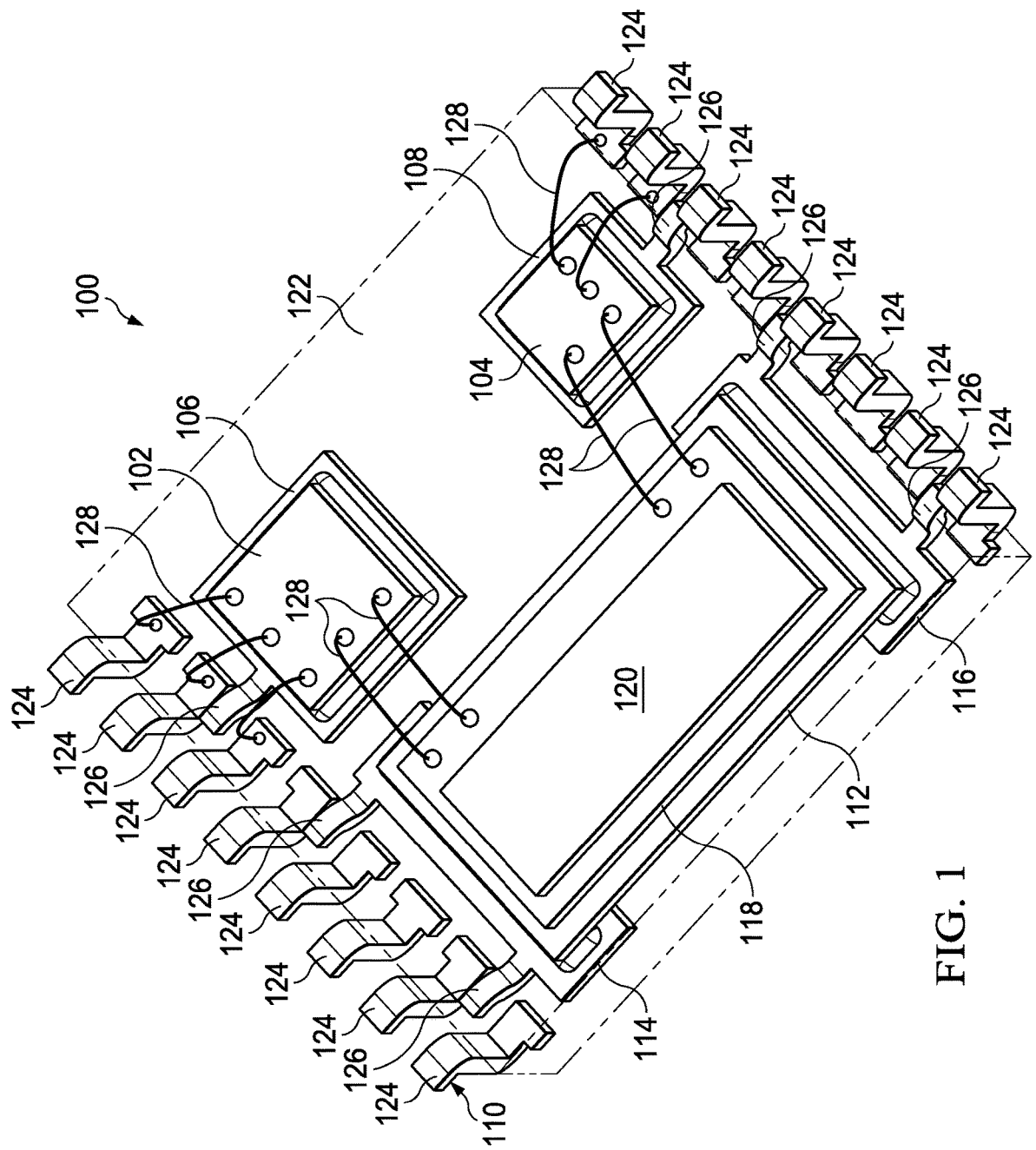
FIG. 1 is a perspective view of an example microelectronic device having floating pads.

The present disclosure is described with reference to the attached figures. The figures are not drawn to scale and they are provided merely to illustrate the disclosure. Several aspects of the disclosure are described below with reference to example applications for illustration. It should be understood that numerous specific details, relationships, and methods are set forth to provide an understanding of the disclosure. The present disclosure is not limited by the illustrated ordering of acts or events, as some acts may occur in different orders and/or concurrently with other acts or events. Furthermore, not all illustrated acts or events are required to implement a methodology in accordance with the present disclosure.

In addition, although some of the embodiments illustrated herein are shown in two dimensional views with various regions having depth and width, it should be clearly understood that these regions are illustrations of only a portion of a device that is actually a three dimensional structure. Accordingly, these regions will have three dimensions, including length, width, and depth, when fabricated on an actual device. Moreover, while the present invention is illustrated by embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

A microelectronic device has a first die, which may be operated at a high voltage, that is, at a potential, for example, above 100 volts, and a second die, which may be operated at a low voltage, that is, a potential, for example, below 10 volts. The first die and the second die are electrically coupled to external leads of the microelectronic device. The first die is not directly electrically coupled to the second die, that is, there is no path for direct current from the first die to the second die. Elements that are not directly electrically coupled are referred to as "electrically isolated" in this disclosure.

The first die is attached to a first die pad, which is electrically conductive, and the second die is attached to a second die pad, which is also electrically conductive. The microelectronic device has a coupler component which is electrically coupled to the first die and the second die, for example through wire bonds. The coupler component may include, for example, transformer windings for transferring electrical signals between the first die and the second die. The coupler component is attached to a first magnetically permeable member, which is electrically conductive. The first magnetically permeable member is attached to a first coupler pad and a second coupler pad which is separate from the first coupler pad. The first coupler pad and the second coupler pad are electrically conductive. The first coupler pad and the second coupler pad are electrically isolated from the first die, and from the external leads, and are thus floating, electrically. The first die pad, the second die pad, the first coupler pad, and the second coupler pad have similar compositions to the external leads. The first die, the second die, the coupler component, and the first magnetically permeable member are contained by a package structure. The first die pad, the second die pad, the first coupler pad, and the second coupler pad are at least partially contained by the package structure. The package structure extends to the external leads.

FIG. 1 is a perspective view of an example microelectronic device having floating pads. The microelectronic device 100 includes a first die 102 and a second die 104. The first die 102 is attached to a first die pad 106 which is electrically conductive. The first die 102 may be attached to the first die pad 106 by an adhesive or a solder, for example. The second die 104 is attached to a second die pad 108, which is also electrically conductive. The first die 102 may be implemented as a high voltage integrated circuit, configured to operate at a potential above 100 volts with respect to a ground pin 110 of the microelectronic device 100. The second die 104 may be implemented as a low voltage die, configured to operate at a potential below 10 volts with respect to the ground pin 110.

The microelectronic device 100 further includes a first magnetically permeable member 112. The first magnetically permeable member 112 includes material having a relative magnetic permeability greater than 1, such as an alloy of nickel, iron, or cobalt. The first magnetically permeable member 112 is electrically conductive. The first magnetically permeable member 112 is attached to a first coupler pad 114 and to a second coupler pad 116 which is separate from the first coupler pad 114. The first coupler pad 114 and the second coupler pad 116 are electrically conductive. The first coupler pad 114 and the second coupler pad 116 are electrically isolated from the first die 102. In this example, the first coupler pad 114 and the second coupler pad 116 are also electrically isolated from the second die 104.

A coupler component 118 of the microelectronic device 100 is attached to the first magnetically permeable member 112. The coupler component 118 may include two or more transformer windings of a transformer, which may be used to transfer electrical signals between the first die 102 and the second die 104. The coupler component 118 may have a laminated structure with the transformer windings separated by layers of electrically insulating material. The coupler component 118 may be attached to the first magnetically permeable member 112 by an adhesive, a tape, or other attaching material. The first magnetically permeable member 112 may improve an efficiency of the transfer of the signals between the windings of the transformer in the coupler component 118 by concentrating magnetic fields generated by electric currents in the windings.

In this example, the microelectronic device 100 may include a second magnetically permeable member 120, attached to the coupler component 118 on an opposite side of the coupler component 118 from the first magnetically permeable member 112, so that the coupler component 118 is disposed between the first magnetically permeable member 112 and the second magnetically permeable member 120. The second magnetically permeable member 120 may have a composition similar to a composition of the first magnetically permeable member 112. The second magnetically permeable member 120 may further improve the efficiency of the transfer of the signals between the windings of the transformer in the coupler component 118.

The microelectronic device 100 includes a package structure 122 which contains at least portions of the first die 102, the second die 104, the first magnetically permeable member 112, the coupler component 118, and the second magnetically permeable member 120. The package structure 122 of this example also contains at least portions of the first die pad 106, the second die pad 108, the first coupler pad 114, and the second coupler pad 116. The package structure 122 may be electrically non-conductive, and may include epoxy or other resin, for example.

The microelectronic device 100 includes external leads 124 which are partially contained by the package structure 122 and extend through an external surface of the package structure 122 to provide connections for the microelectronic device 100. The ground pin 110 may be implemented as one of the external leads 124. The external leads 124 are electrically conductive, and may include, for example, copper or stainless steel, optionally with layers of metals such as nickel, gold, platinum, silver, or palladium. The first die pad 106, the second die pad 108, the first coupler pad 114, and the second coupler pad 116 have compositions and layer structures that are similar to the composition and layer structure of the external leads 124. In this example, support bars 126 extend from the first die pad 106, the second die pad 108, the first coupler pad 114, and the second coupler pad 116 to an external surface of the package structure 122. The support bars 126 also have compositions and layer structures that are similar to the composition and layer structure of the external leads 124. The support bars 126 are electrically isolated from the external leads 124. Thus, no direct current can flow between the support bars 126 and the external leads 124. The support bars 126 may optionally terminate close to the external surface of the package structure 122, for example within 250 microns of the external surface, to reduce interference of the support bars 126 with external connections to the microelectronic device 100. In this example, the support bars 126 may extend between the external leads 124 at the external surface of the package structure 122, as depicted in FIG. 1.

The first die 102 and the second die 104 may be electrically coupled to one or more of the external leads 124 through wire bonds 128. The first die 102 may optionally be connected to the first die pad 106 through one or more wire bonds 128, as depicted in FIG. 1. Similarly, the second die 104 may optionally be connected to the second die pad 108 through one or more wire bonds 128. The first die 102 and the second die 104 may be electrically coupled to the coupler component 118 through one or more wire bonds 128.

In this example, the first die pad 106, the second die pad 108, the first coupler pad 114, and the second coupler pad 116 are not directly electrically coupled to the external leads 124. The first coupler pad 114 and the second coupler pad 116 are not directly electrically coupled to the first die pad 106 or the second die pad 108; the first coupler pad 114 and the second coupler pad 116 are electrically isolated from the first die pad 106 and the second die pad 108.

During operation of the microelectronic device 100, the first die 102 may be operated at a high voltage, that is, at a potential above 100 volts, and the second die 104 may be operated at a low voltage, that is, a potential below 10 volts. Because the first coupler pad 114 and the second coupler pad 116 are electrically isolated from the first die pad 106 and the second die pad 108, leakage current from the first die pad 106 through the first coupler pad 114, through the first magnetically permeable member 112, and through the second coupler pad 116, to the second die pad 108 may be reduced to a desired level. The first magnetically permeable member 112 need not be coated with electrically insulating material, thus advantageously reducing a fabrication cost of the microelectronic device 100. Because the first die pad 106, the second die pad 108, the first coupler pad 114, the second coupler pad 116, and the support bars 126 have compositions and layer structures that are similar to the composition and layer structure of the external leads 124, the first die pad 106, the second die pad 108, the first coupler pad 114, the second coupler pad 116, the support bars 126, and the external leads 124 may be formed from a common lead frame, further reducing the fabrication cost of the microelectronic device 100, compared with assembling the first die pad 106, the second die pad 108, the first coupler pad 114, the second coupler pad 116, and the external leads 124 from separate parts.

Figure 2A:
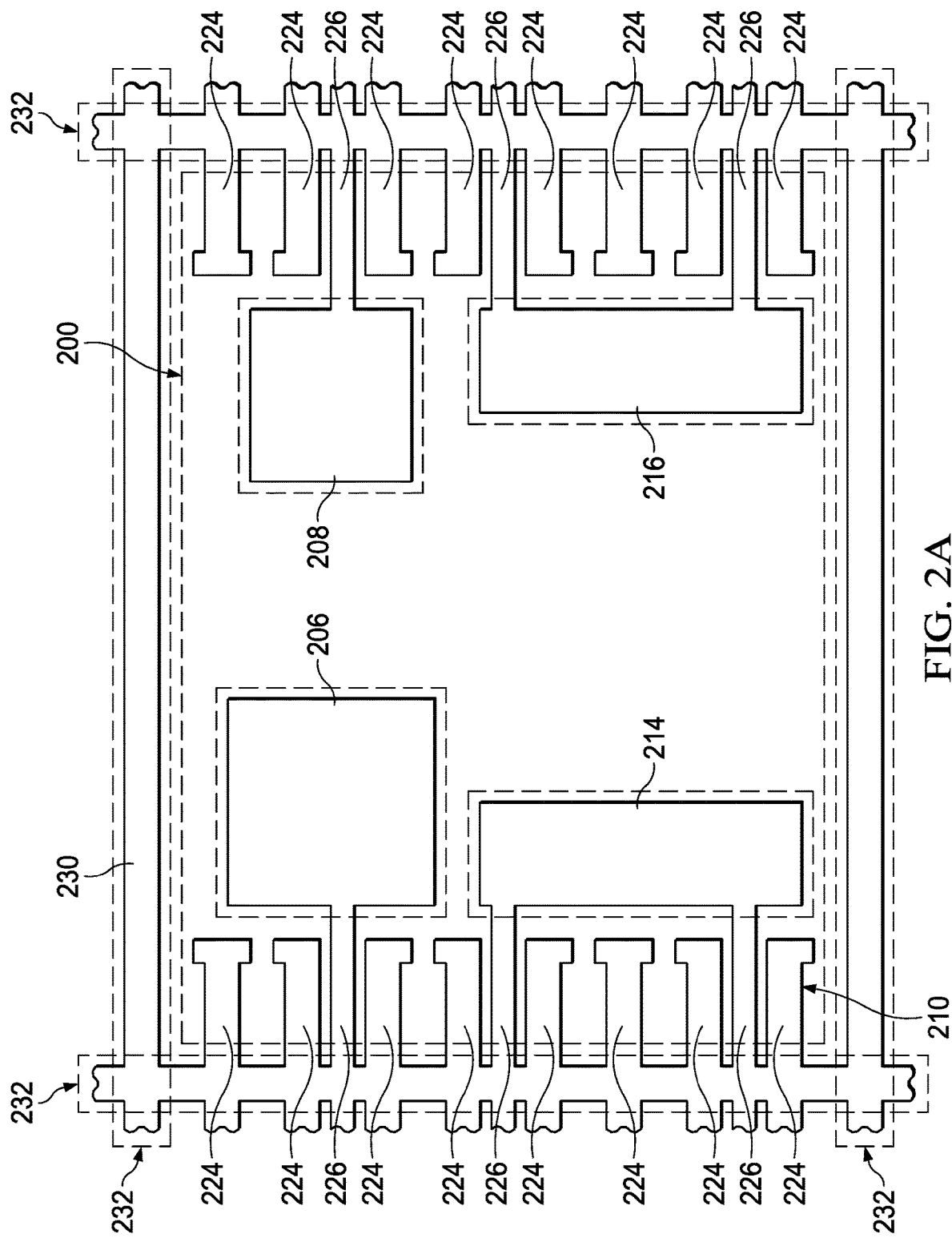

FIG. 2A through FIG. 2J are top views and cross sections of a microelectronic device having floating pads, depicted at stages of an example method of formation. Referring to FIG. 2A, a lead frame 230 is acquired. The lead frame 230 includes tie bars 232 outside of an area for the microelectronic device 200. The lead frame 230 includes external leads 224 which extend from the tie bars 232 into the area for the microelectronic device 200. One of the external leads 224 may provide a ground pin 210 of the microelectronic device 200. The lead frame 230 also includes support bars 226 which extend from the tie bars 232 into the area for the microelectronic device 200. The lead frame 230 further includes a first die pad 206 attached to the tie bars 232 through one or more of the support bars 226, a second die pad 208 attached to the tie bars 232 through one or more of the support bars 226, a first coupler pad 214 attached to the tie bars 232 through one or more of the support bars 226, and a second coupler pad 216 attached to the tie bars 232 through one or more of the support bars 226. The first die pad 206, the second die pad 208, the first coupler pad 214, and the second coupler pad 216 are located in the area for the microelectronic device 200. The support bars 226 do not contact the external leads 224 in the area for the microelectronic device 200. In this example, one or more of the support bars 226 may extend between the external leads 224, as depicted in FIG. 2A.

The lead frame 230 is electrically conductive, and may include, for example, copper or stainless steel, and may include layers of metal such as nickel, gold, platinum, silver, or palladium, to reduce oxidation, corrosion, or to improve solderability or wire bondability. The lead frame 230 may be formed by stamping, etching, or other processes. The lead frame 230 may include areas for additional microelectronic devices, with corresponding external leads, support bars, and die pads.

Figure 2B:
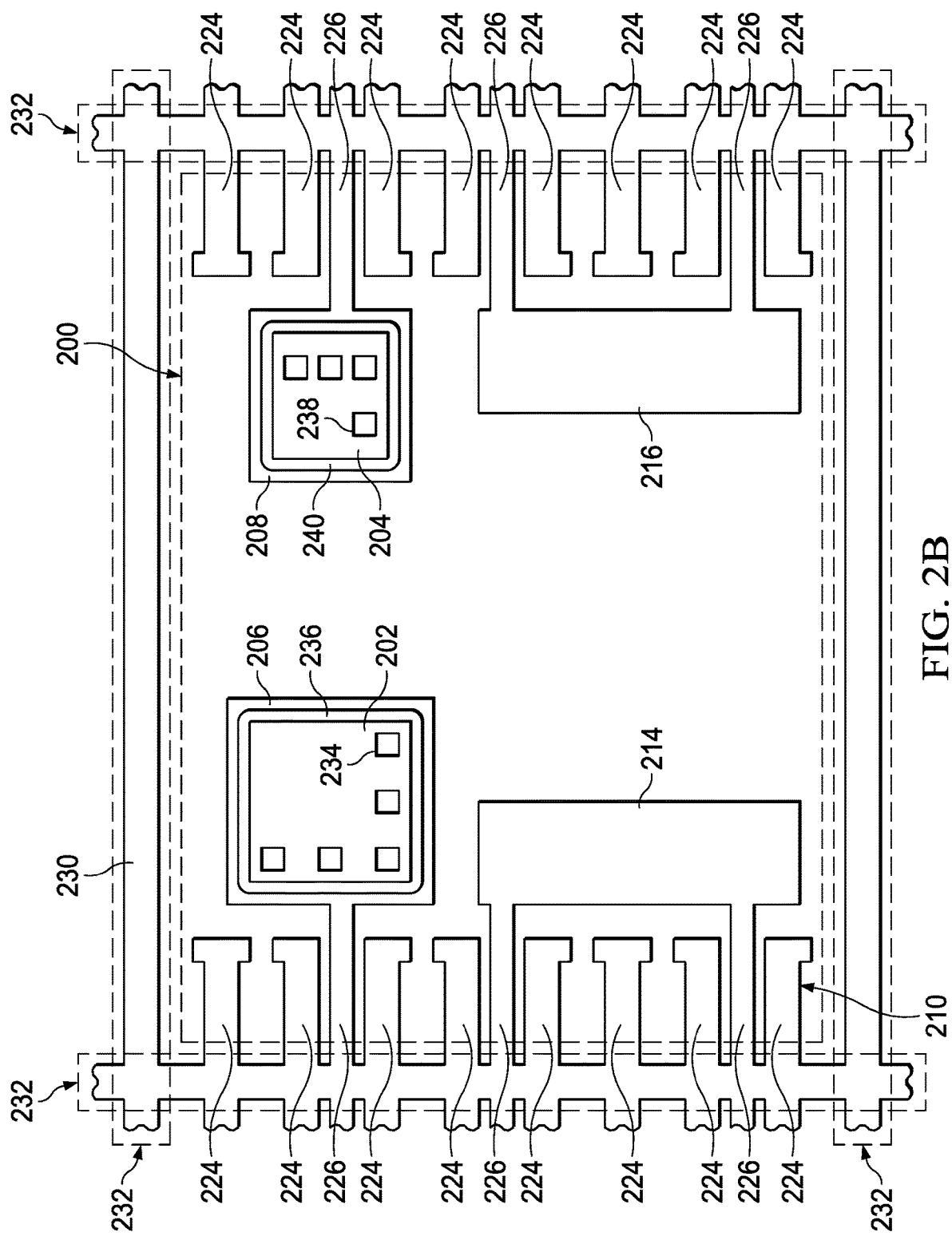

Referring to FIG. 2B, a first die 202 is attached to the first die pad 206. The first die 202 may be implemented as a high voltage integrated circuit, configured to operate at a potential above 100 volts with respect to the ground pin 210 of the microelectronic device 200. The first die 202 may have first bond pads 234 for subsequently-formed wire bonds 228, shown in FIG. 2E. The first die 202 may be attached to the first die pad 206 by a first attach material 236. The first attach material 236 may be implemented as an electrically non-conductive adhesive, an electrically conductive adhesive, or a solder, for example. Other materials for the first attach material 236 are within the scope of this example.

A second die 204 is attached to the second die pad 208. The second die 204 may be implemented as a low voltage die, configured to operate at a potential below 10 volts with respect to the ground pin 210. The second die 204 may have second bond pads 238 for the subsequently-formed wire bonds 228. The second die 204 may be attached to the second die pad 208 by a second attach material 240. The second attach material 240 may be implemented as an electrically non-conductive adhesive, an electrically conductive adhesive, or a solder, for example. The second attach material 240 may have a composition that is similar to a composition of the first attach material 236, or may have a composition that is different from the composition of the first attach material 236. For example, the first attach material 236 may be electrically non-conductive, while the second attach material 240 may be electrically conductive.

Figure 2C:
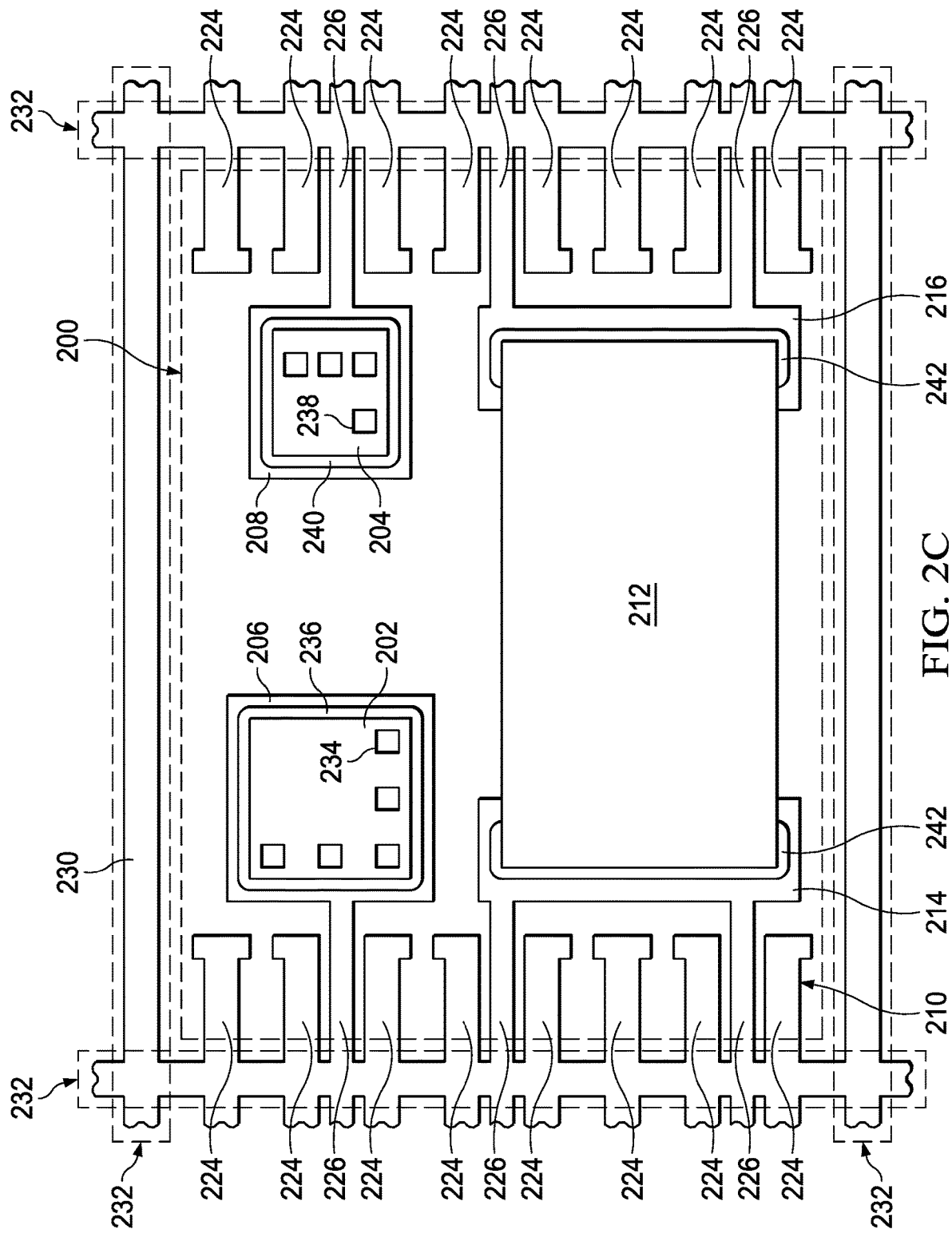

Referring to FIG. 2C, a first magnetically permeable member 212 is attached to the first coupler pad 214 and to the second coupler pad 216. The first magnetically permeable member 212 includes material having a relative magnetic permeability greater than 1, such as an alloy of nickel, iron, or cobalt. The first magnetically permeable member 212 is electrically conductive. The first magnetically permeable member 212 may be free of an electrically insulating coating, which may advantageously reduce a fabrication cost of the microelectronic device 200. The first magnetically permeable member 212 may be attached to the first coupler pad 214 and the second coupler pad 216 with a third attach material 242. The third attach material 242 may have a composition that is similar to the composition of the first attach material 236 or to the composition of the second attach material 240. Alternatively, the third attach material 242 may have a composition that is different from the composition of the first attach material 236 and the composition of the second attach material 240.

Figure 2D:
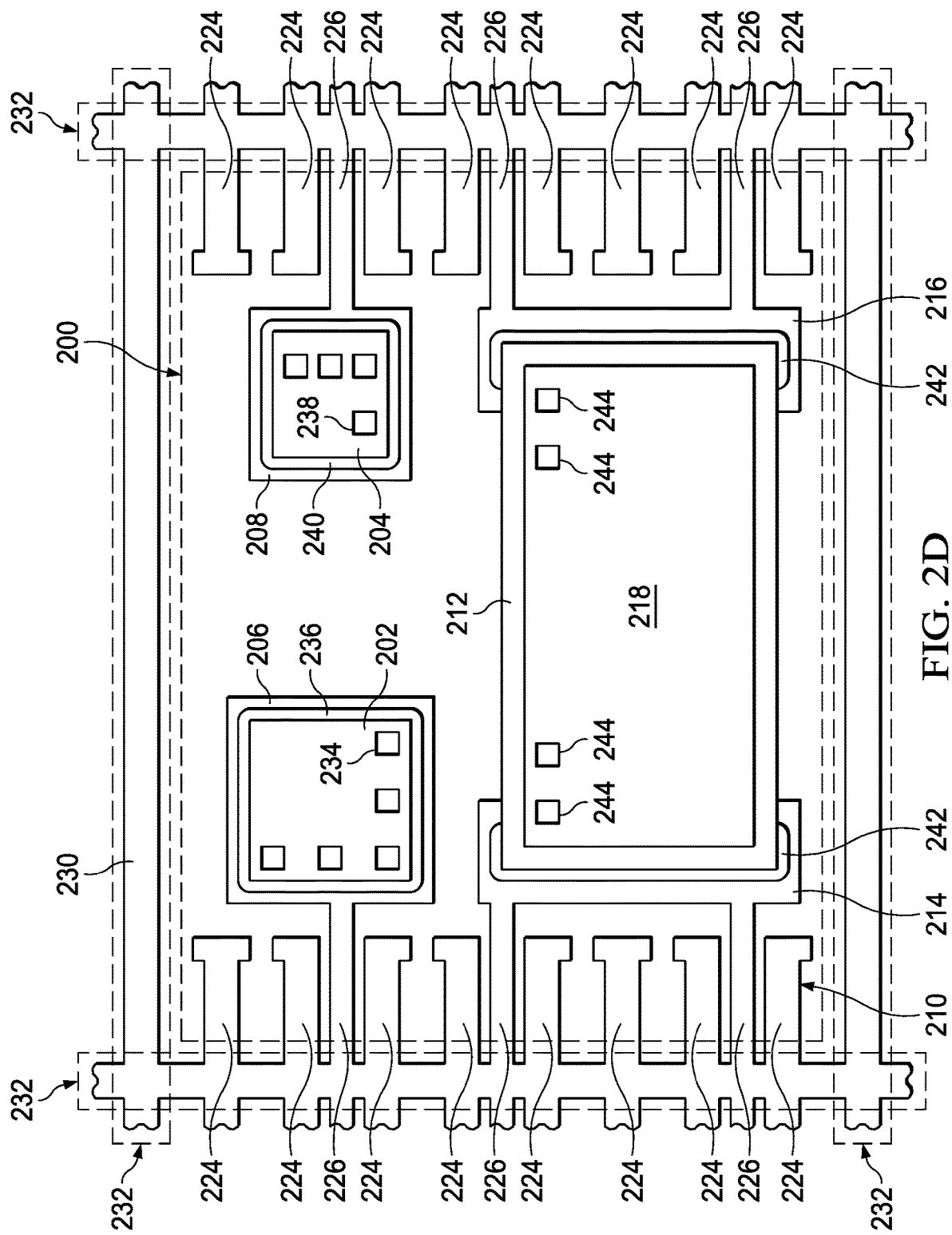

Referring to FIG. 2D, a coupler component 218 is attached to the first magnetically permeable member 212. The coupler component 218 may have a laminated structure with layers of electrically insulating material separating transformer windings. The coupler component 218 may be attached to the first magnetically permeable member 212 using an adhesive, a tape, or other attaching material. The coupler component 218 may have third bond pads 244 for the subsequently-formed wire bonds 228, shown in FIG. 2E.

Figure 2E:
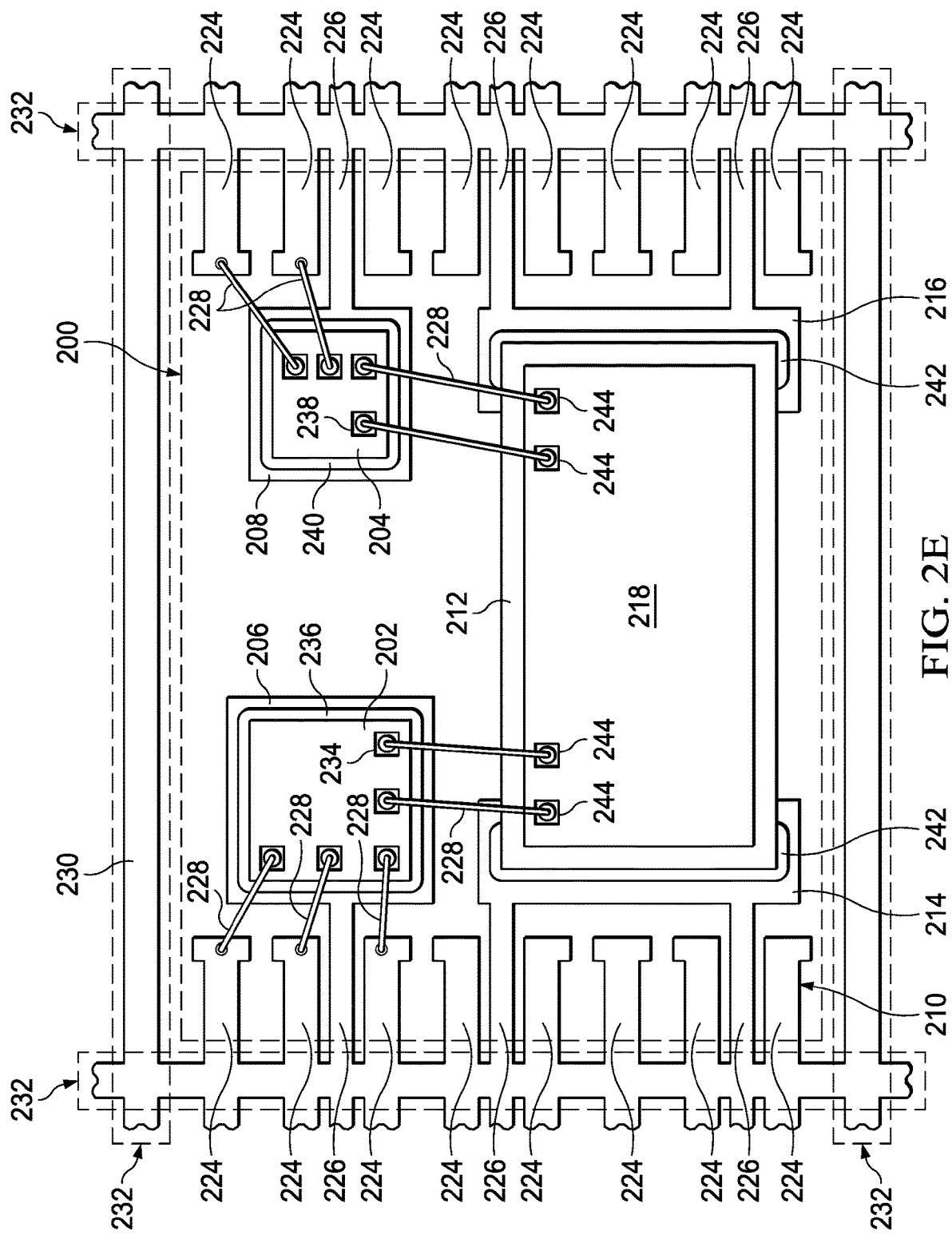

Referring to FIG. 2E, the wire bonds 228 are formed to electrically connect the first die 202 with one or more of the external leads 224, to electrically connect the second die 204 with one or more of the external leads 224, to electrically connect the first die 202 with the coupler component 218, and to electrically connect the second die 204 with the coupler component 218. The wire bonds 228 may be implemented as round wire bonds using gold, aluminum, or copper bond wire, or may be implemented as ribbon bonds using gold, aluminum, or copper ribbon wire. The wire bonds 228 may be formed using a wire bonds process or a ribbon bonding process, as appropriate. The wire bonds 228 may terminate on the first bond pads 234, the second bond pads 238, and the third bond pads 244, as depicted in FIG. 2E.

Figure 2F:
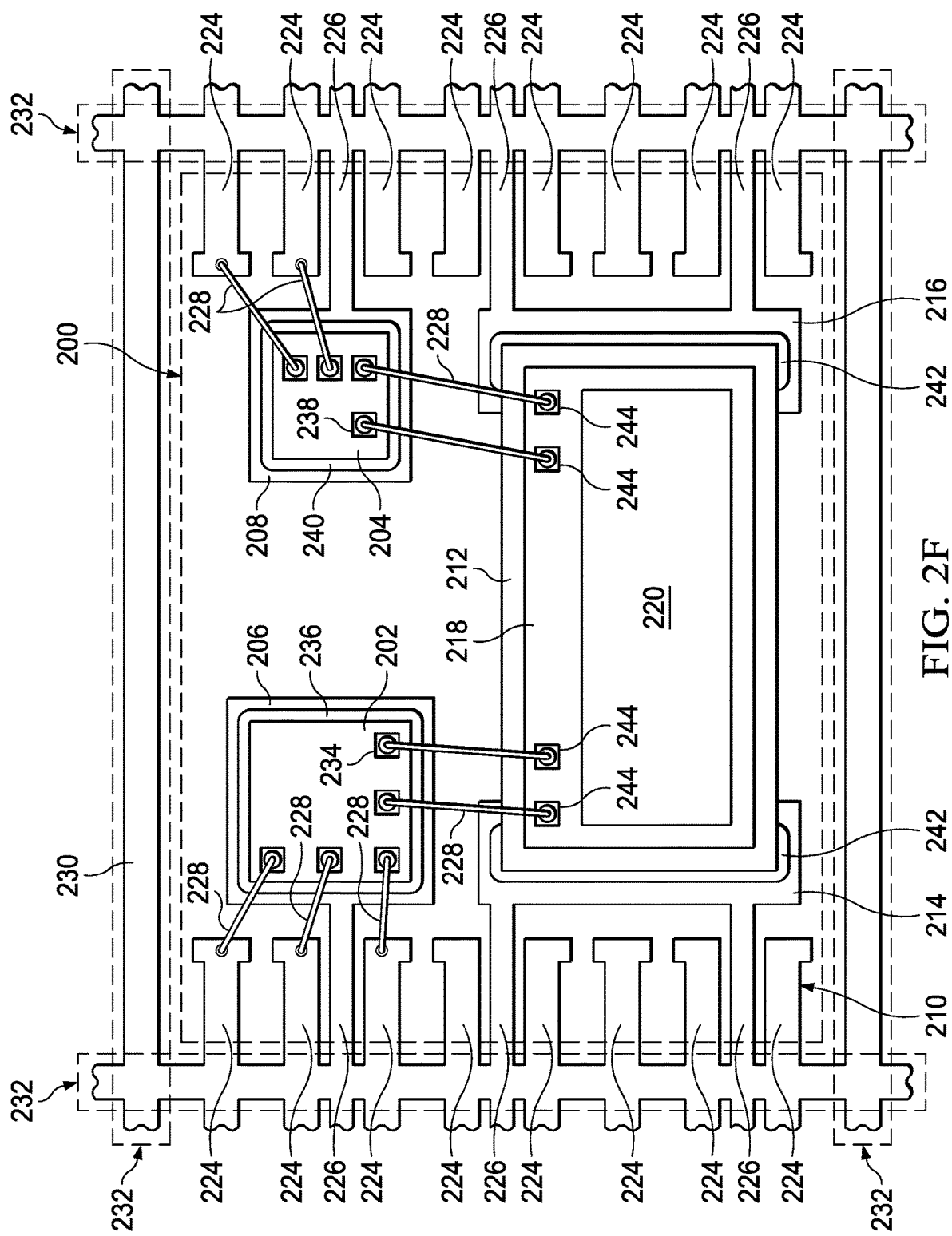

Referring to FIG. 2F, a second magnetically permeable member 220 is attached to the coupler component 218, on an opposite side of the coupler component 218 from the first magnetically permeable member 212, so that the coupler component 218 is disposed between the first magnetically permeable member 212 and the second magnetically permeable member 220. The second magnetically permeable member 220 may have a composition similar to a composition of the first magnetically permeable member 212. The second magnetically permeable member 220 may be attached to the coupler component 218 using an adhesive, a tape, or other attaching material. The second magnetically permeable member 220 may be attached to the coupler component 218 using a similar material or process used to attach the coupler component 218 to the first magnetically permeable member 212.

Figure 2G:
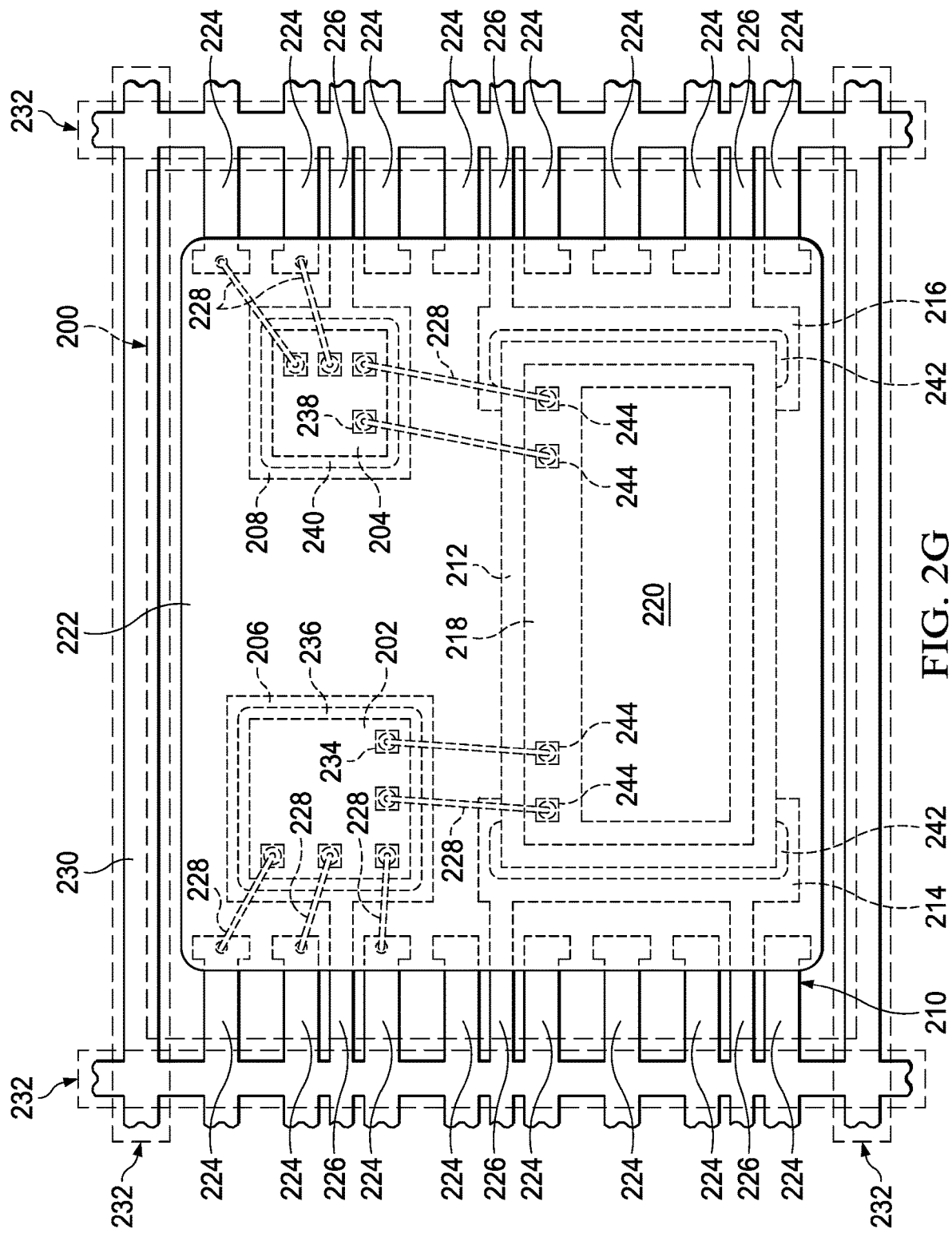

Referring to FIG. 2G, a package structure 222 is formed on the first die 202, the second die 204, the first magnetically permeable member 212, the coupler component 218, and the second magnetically permeable member 220, and extending to the external leads 224 and the support bars 226. The package structure 222 may include epoxy or other resin, for example, and may be formed by injection molding or other packaging process. In this example, the package structure 222 may contain the first die 202, the second die 204, the first magnetically permeable member 212, the coupler component 218, and the second magnetically permeable member 220. The package structure 222 may also contain the first die pad 206, the second die pad 208, the first coupler pad 214, and the second coupler pad 216.

Figure 2H:
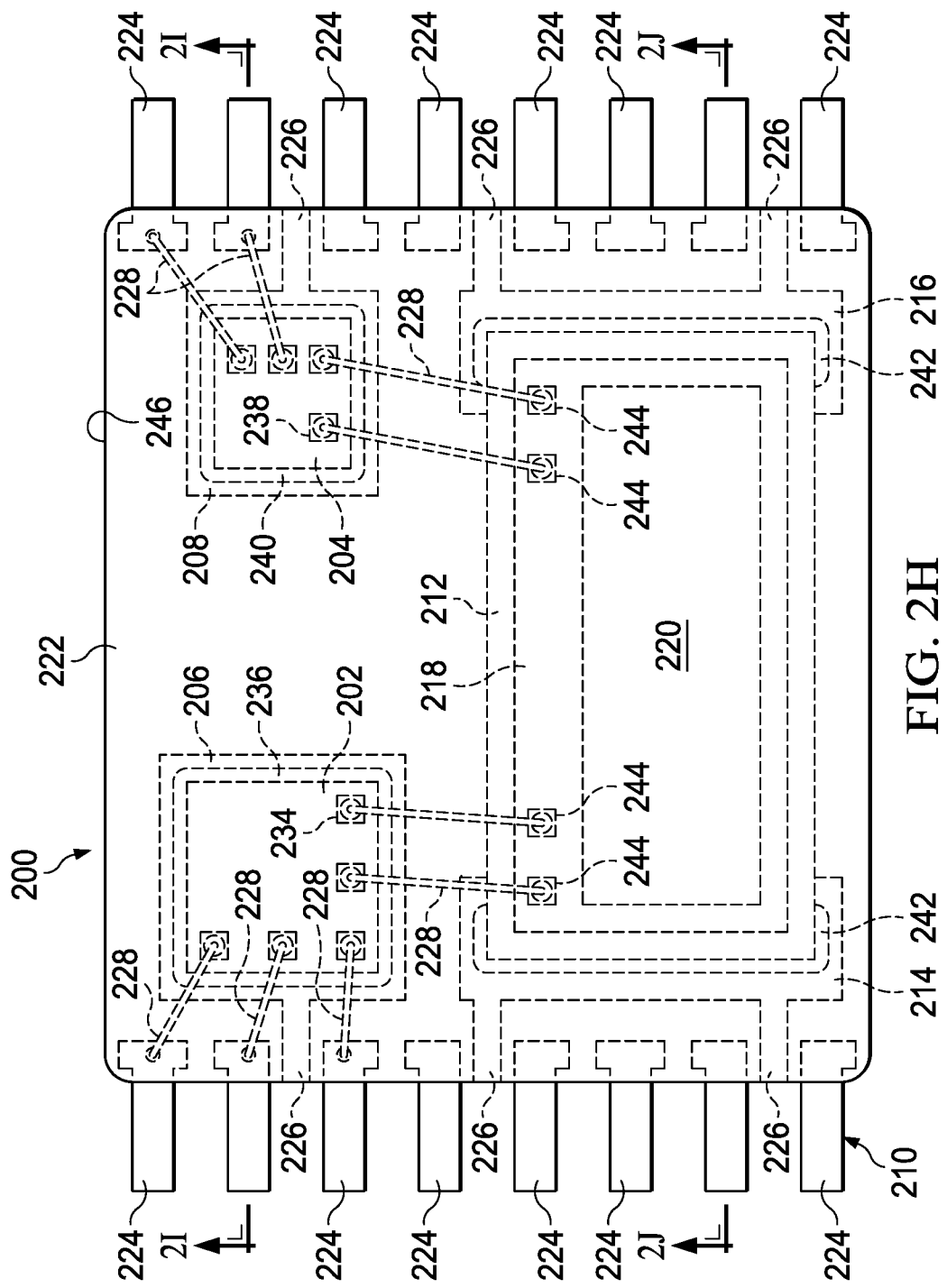

Referring to FIG. 2H, the external leads 224 are separated from the tie bars 232 of FIG. 2G, leaving each external lead 224 extending through an external surface 246 of the package structure 222, so that a portion of each external lead 224 extends from the package structure 222. The support bars 226 are separated from the tie bars 232, leaving the first die pad 206, the second die pad 208, the first coupler pad 214, and the second coupler pad 216 electrically isolated from the external leads 224. The support bars 226 may be separated from the tie bars 232 close to the external surface 246 of the package structure 222, so that the support bars 226 extend past the external surface 246 by a distance less than 250 microns, for example. The support bars 226 may be separated from the tie bars 232 at the external surface 246, as depicted in FIG. 2H. The support bars 226 and the external leads 224 may be separated from the tie bars 232 concurrently, or in separate operations. The support bars 226 and the external leads 224 may be separated from the tie bars 232 by a shearing process, for example.

FIG. 2I is a cross section of the microelectronic device 200 through the first die 202 and the second die 204. The external leads 224 are shaped into a desired configuration, such as a gull-wing configuration depicted in FIG. 2I. In this example, the package structure 222 surrounds the first die 202, the second die 204, the first die pad 206, and the second die pad 208.

FIG. 2J is a cross section of the microelectronic device 200 through the first magnetically permeable member 212, the coupler component 218, and the second magnetically permeable member 220. In this example, the package structure 222 surrounds the first magnetically permeable member 212, the coupler component 218, the second magnetically permeable member 220, the first coupler pad 214, and the second coupler pad 216.

Figure 3A:
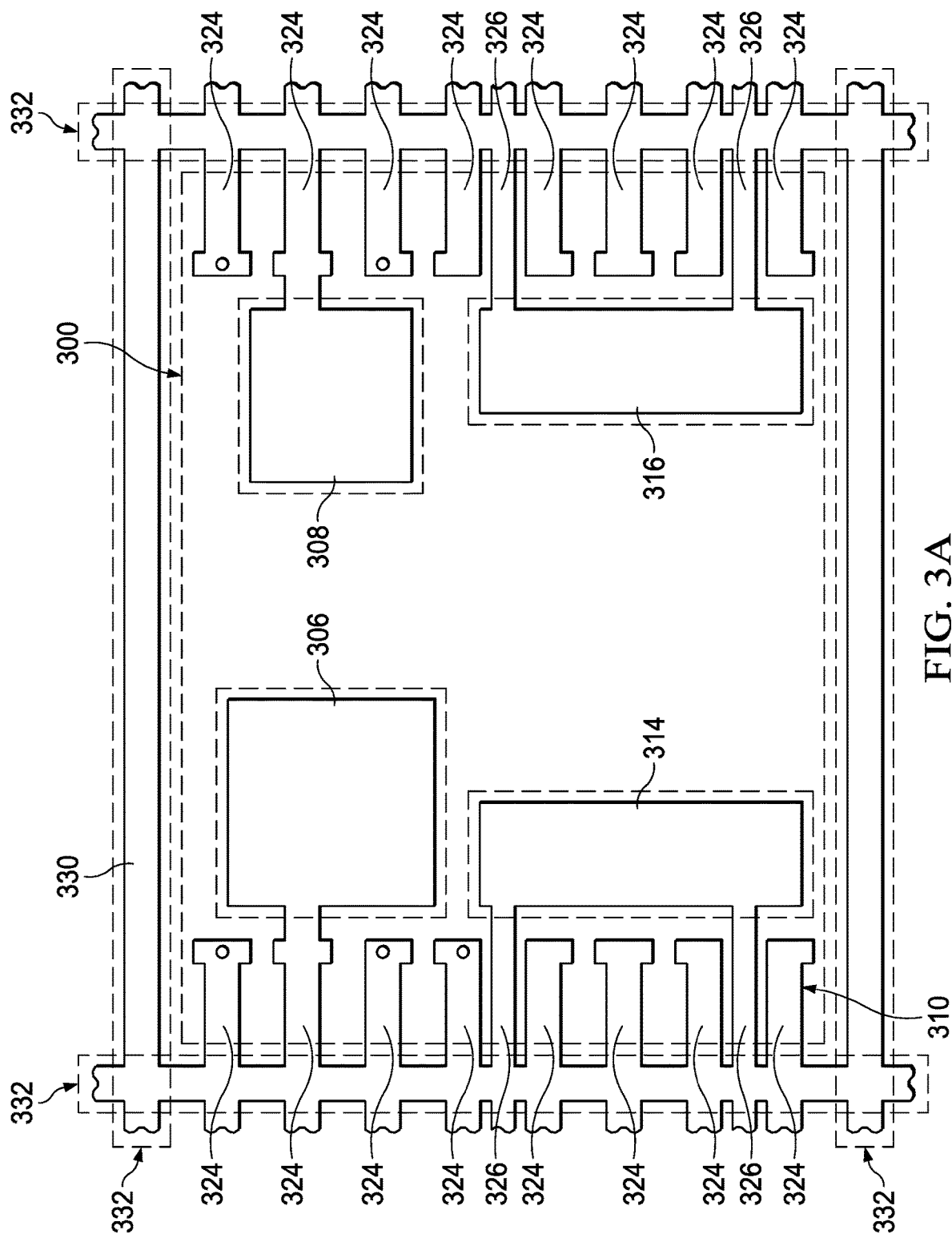

FIG. 3A through FIG. 3F are top views and cross sections of a microelectronic device having floating pads, depicted at stages of another example method of formation. Referring to FIG. 3A, a lead frame 330 is acquired. The lead frame 330 includes tie bars 332 outside of an area for the microelectronic device 300. The lead frame 330 includes external leads 324 and support bars 326, both of which extend from the tie bars 332 into the area for the microelectronic device 300. One of the external leads 324 may provide a ground pin 310 of the microelectronic device 300. The lead frame 330 further includes a first die pad 306 attached to the tie bars 332 through one or more of the external leads 324, a second die pad 308 attached to the tie bars 332 through one or more of the external leads 324, a first coupler pad 314 attached to the tie bars 332 through one or more of the support bars 326, and a second coupler pad 316 attached to the tie bars 332 through one or more of the support bars 326. The first die pad 306, the second die pad 308, the first coupler pad 314, and the second coupler pad 316 are located in the area for the microelectronic device 300. The support bars 326 do not contact the external leads 324 in the area for the microelectronic device 300. In this example, one or more of the support bars 326 may extend between the external leads 324, as depicted in FIG. 3A.

The lead frame 330 is electrically conductive, and may include, for example, copper or stainless steel, and may include layers of metal such as nickel, gold, platinum, silver, or palladium, to reduce oxidation, corrosion, or to improve solderability or wire bondability. The lead frame 330 may be formed by stamping, etching, or other processes. The lead frame 330 may include areas for additional microelectronic devices, with corresponding external leads, support bars, and die pads.

Figure 3B:
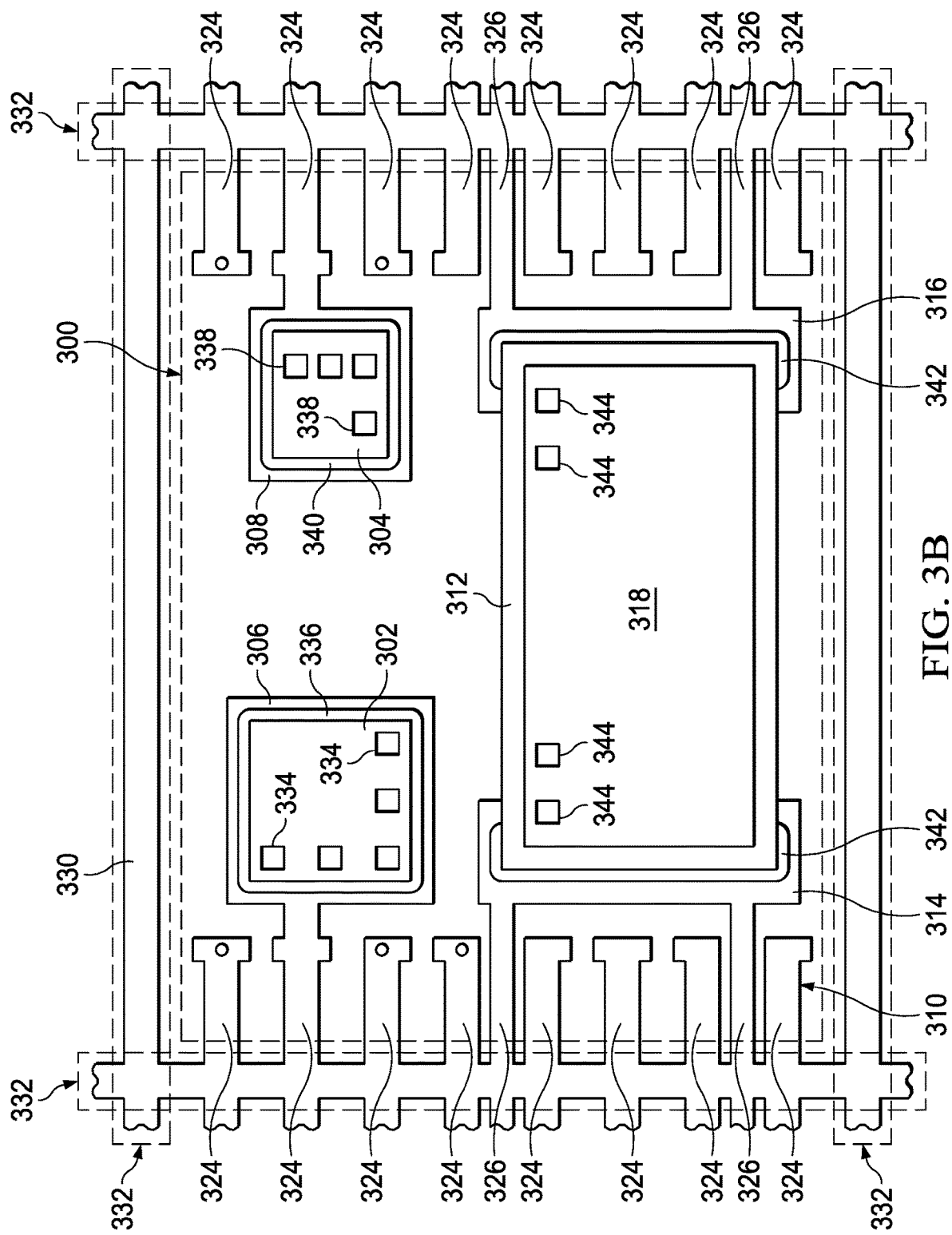

Referring to FIG. 3B, a first die 302 is attached to the first die pad 306. The first die 302 may be implemented as a high voltage integrated circuit, configured to operate at a potential above 100 volts with respect to the ground pin 310 of the microelectronic device 300. The first die 302 may have first bond pads 334 for subsequently-formed wire bonds 328, shown in FIG. 3C. The first die 302 may be attached to the first die pad 306 by a first attach material 336. The first attach material 336 may be implemented as an electrically non-conductive adhesive, an electrically conductive adhesive, or a solder, for example. Other materials for the first attach material 336 are within the scope of this example.

A second die 304 is attached to the second die pad 308. The second die 304 may be implemented as a low voltage die, configured to operate at a potential below 10 volts with respect to the ground pin 310. The second die 304 may have second bond pads 338 for the subsequently-formed wire bonds 328. The second die 304 may be attached to the second die pad 308 by a second attach material 340. The second attach material 340 may be implemented as an electrically non-conductive adhesive, an electrically conductive adhesive, or a solder, for example. The second attach material 340 may have a composition that is similar to a composition of the first attach material 336, or may have a composition that is different from the composition of the first attach material 336. For example, the first attach material 336 may be electrically non-conductive, while the second attach material 340 may be electrically conductive.

A magnetically permeable member 312 is attached to the first coupler pad 314 and to the second coupler pad 316. The magnetically permeable member 312 includes material having a relative magnetic permeability greater than 1, such as an alloy of nickel, iron, or cobalt. The magnetically permeable member 312 is electrically conductive. The magnetically permeable member 312 may be free of an electrically insulating coating, which may advantageously reduce a fabrication cost of the microelectronic device 300. The magnetically permeable member 312 may be attached to the first coupler pad 314 and the second coupler pad 316 with a third attach material 342. The third attach material 342 may have a composition that is similar to the composition of the first attach material 336 or to the composition of the second attach material 340. Alternatively, the third attach material 342 may have a composition that is different from the composition of the first attach material 336 and the composition of the second attach material 340.

A coupler component 318 is attached to the magnetically permeable member 312. The coupler component 318 may have a laminated structure with layers of electrically insulating material separating transformer windings. The coupler component 318 may be attached to the magnetically permeable member 312 using an adhesive, a tape, or other attaching material. The coupler component 318 may have third bond pads 344 for the subsequently-formed wire bonds 328, shown in FIG. 3C.

Figure 3C:
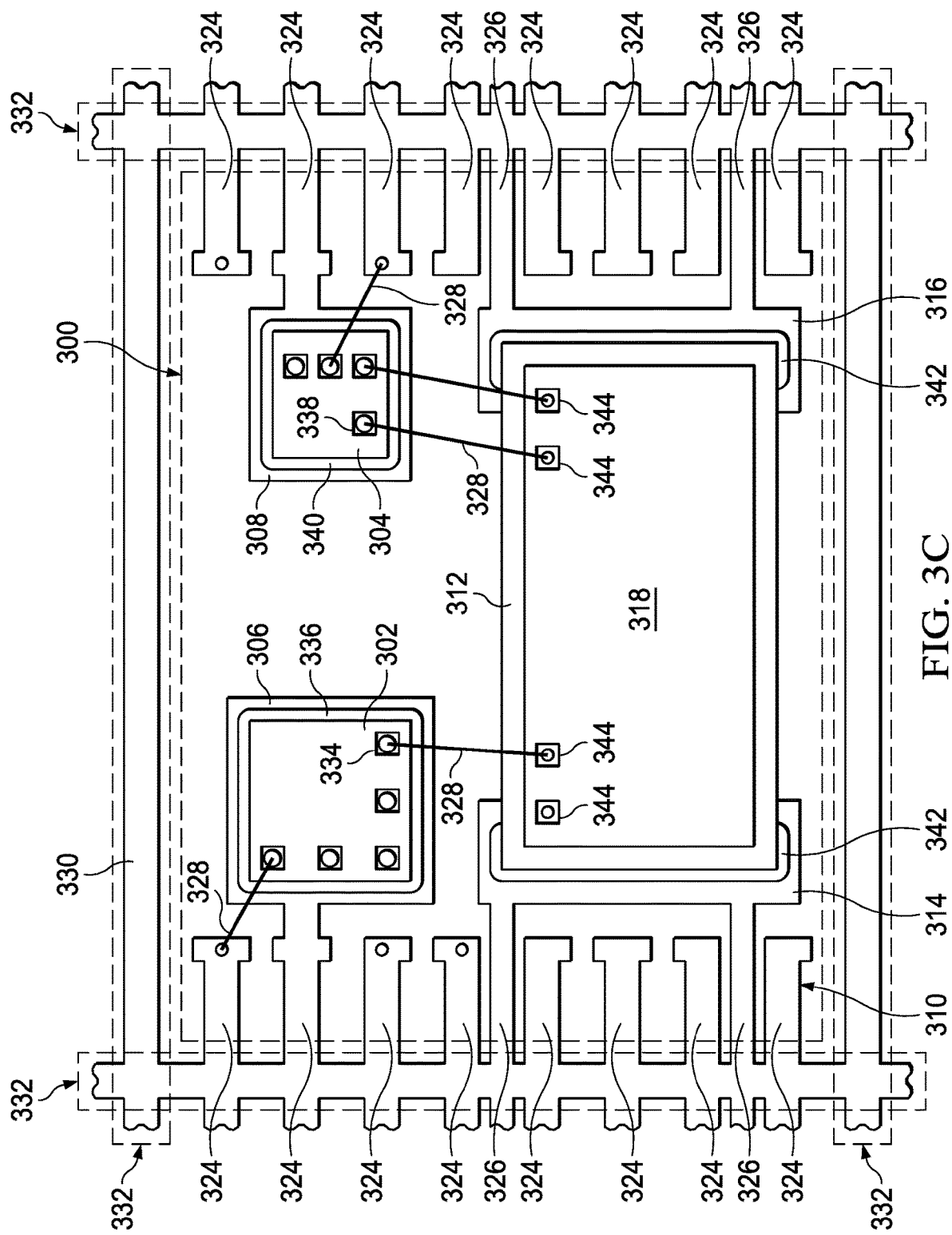

Referring to FIG. 3C, the wire bonds 328 are formed to electrically connect the first die 302 with one or more of the external leads 324, to electrically connect the second die 304 with one or more of the external leads 324, to electrically connect the first die 302 with the coupler component 318, and to electrically connect the second die 304 with the coupler component 318. The wire bonds 328 may be implemented as round wire bonds using gold, aluminum, or copper bond wire, or may be implemented as ribbon bonds using gold, aluminum, or copper ribbon wire. The wire bonds 328 may be formed using a wire bonds process or a ribbon bonding process, as appropriate. The wire bonds 328 may terminate on the first bond pads 334, the second bond pads 338, and the third bond pads 344, as depicted in FIG. 3C.

Figure 3D:
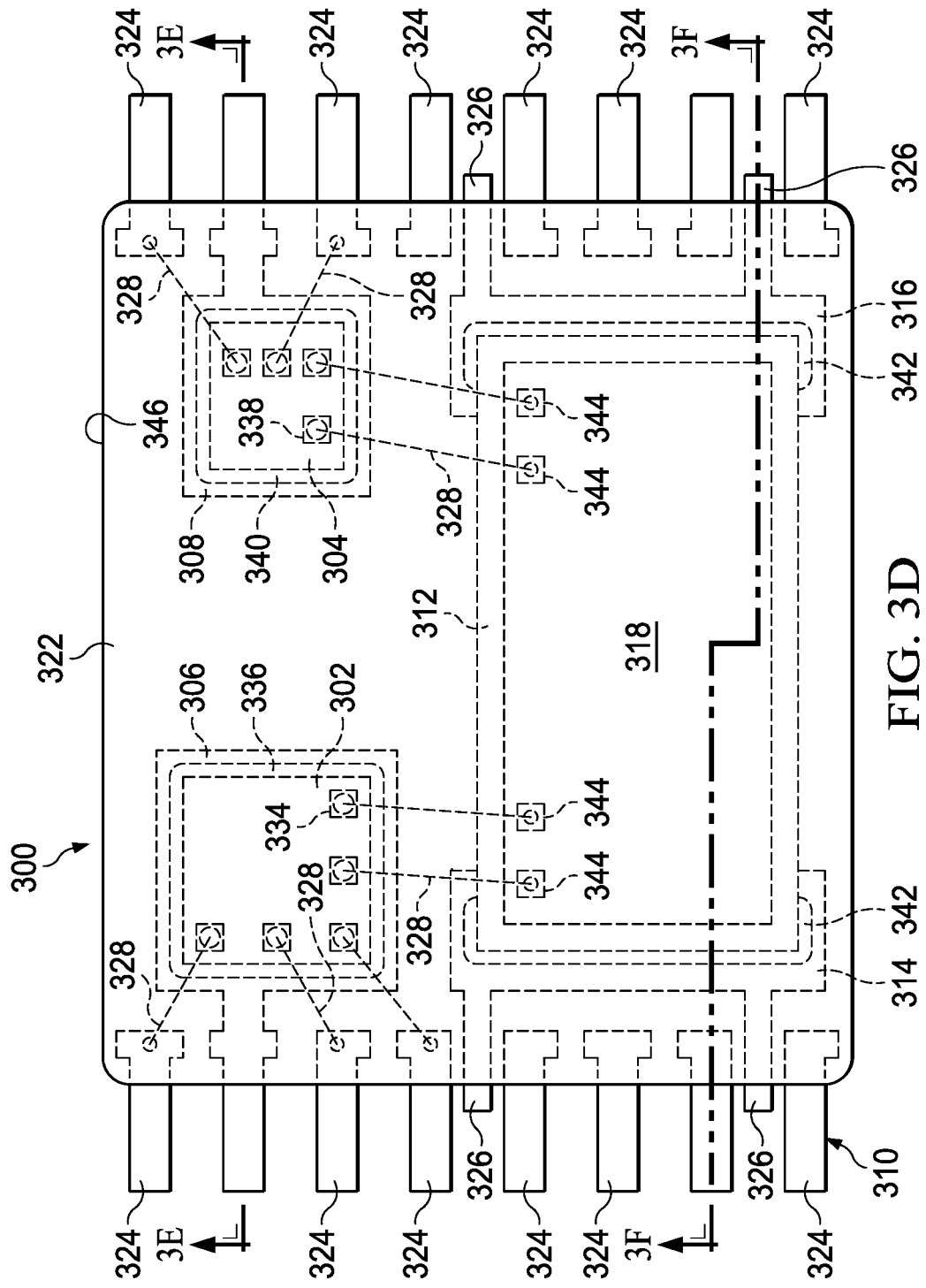

Referring to FIG. 3D, a package structure 322 is formed on the first die 302, the second die 304, the magnetically permeable member 312, and the coupler component 318, and extending to the external leads 324 and the support bars 326. The package structure 322 may include epoxy or other resin, for example, and may be formed by injection molding or other packaging process. In this example, the package structure 322 may contain the first die 302, the second die 304, the magnetically permeable member 312, and the coupler component 318. The package structure 322 may also contain the first die pad 306 and the second die pad 308, while exposing portions of the first coupler pad 314 and the second coupler pad 316.

The external leads 324 are separated from the tie bars 332 of FIG. 3C, leaving each external lead 324 extending through an external surface 346 of the package structure 322, so that a portion of each external lead 324 extends from the package structure 322. The support bars 326 are separated from the tie bars 332, leaving the first coupler pad 314 and the second coupler pad 316 electrically isolated from the external leads 324. In this example, the first die pad 306 and the second die pad 308 remain connected to one or more external leads 324. The support bars 326 may be separated from the tie bars 332, so that the support bars 326 extend past an external surface 346 by a distance that facilitates the separation process, for example a distance of 250 microns to 1000 microns. The support bars 326 and the external leads 324 may be separated from the tie bars 332 concurrently, or in separate operations. The support bars 326 and the external leads 324 may be separated from the tie bars 332 by a shearing process, for example.

FIG. 3E is a cross section of the microelectronic device 300 through the first die 302 and the second die 304. The external leads 324 are shaped into a desired configuration, for example, to provide a dual-flat no-leads (DFN) structure, as indicated in FIG. 3E. In this example, the package structure 322 contains at least portions of the first die 302, the second die 304, the first die pad 306, and the second die pad 308. In another version of this example, the external leads 324 may be distributed on four sides of the microelectronic device 300, and may be shaped to provide a quad-flat no-leads (QFN) structure.

FIG. 3F is a cross section of the microelectronic device 300 through the magnetically permeable member 312, and the coupler component 318. In this example, the package structure 322 contains at least portions of the magnetically permeable member 312 and the coupler component 318. Portions of the first coupler pad 314 and the second coupler pad 316 are exposed at the external surface 346 of the package structure 322. The portions of the first coupler pad 314 and the second coupler pad 316 that are exposed at the package structure 322 may enable efficient removal of heat from the microelectronic device 300 during operation.

Figure 4A:
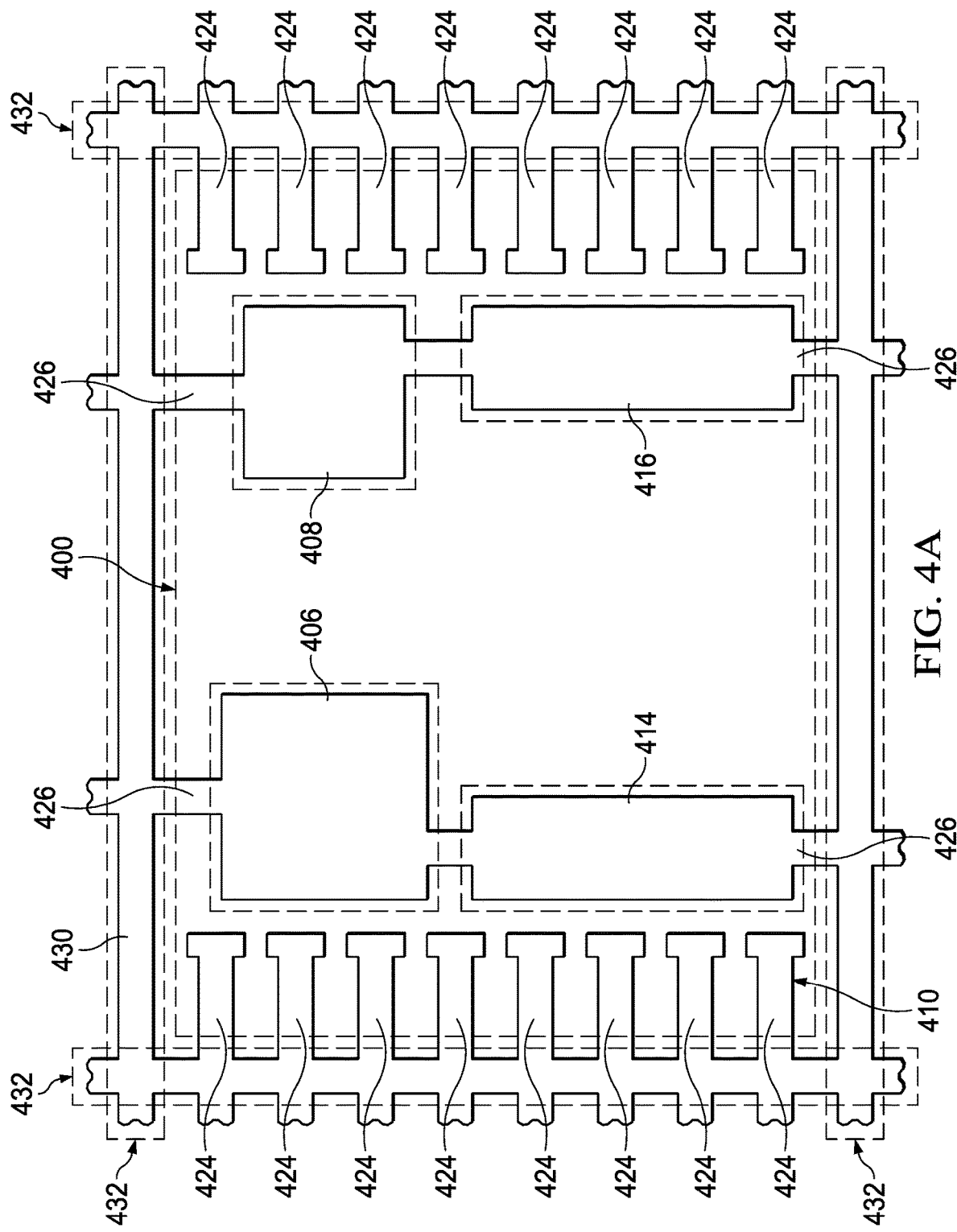

FIG. 4A through FIG. 4E are top views and cross sections of a microelectronic device having floating pads, depicted at stages of another example method of formation. Referring to FIG. 4A, a lead frame 430 is acquired. The lead frame 430 includes tie bars 432 outside of an area for the microelectronic device 400. The lead frame 430 includes external leads 424 and support bars 426, both of which extend from the tie bars 432 into the area for the microelectronic device 400. One of the external leads 424 may provide a ground pin 410 of the microelectronic device 400. The lead frame 430 further includes a first die pad 406 attached to the tie bars 432 through one or more of the support bars 426, a second die pad 408 attached to the tie bars 432 through one or more of the support bars 426, a first coupler pad 414 attached to the tie bars 432 through one or more of the support bars 426, and a second coupler pad 416 attached to the tie bars 432 through one or more of the support bars 426. The first die pad 406, the second die pad 408, the first coupler pad 414, and the second coupler pad 416 are located in the area for the microelectronic device 400. In this example, the first coupler pad 414 may be directly electrically coupled to the first die pad 406 through a portion of the lead frame 430, as depicted in FIG. 4A. Similarly, the second coupler pad 416 may be directly electrically coupled to the second die pad 408 through a portion of the lead frame 430. The support bars 426 do not contact the external leads 424 in the area for the microelectronic device 400. In this example, one or more of the support bars 426 may extend to the tie bars 432 on different sides of the area for the microelectronic device 400 than the external leads 424, as depicted in FIG. 4A. The lead frame 430 is electrically conductive, and may include, for example, copper or stainless steel, and may include layers of metal such as nickel, gold, platinum, silver, or palladium, to reduce oxidation, corrosion, or to improve solderability or wire bondability. The lead frame 430 may be formed by stamping, etching, or other processes. The lead frame 430 may include areas for additional microelectronic devices, with corresponding external leads, support bars, and die pads.

Figure 4B:
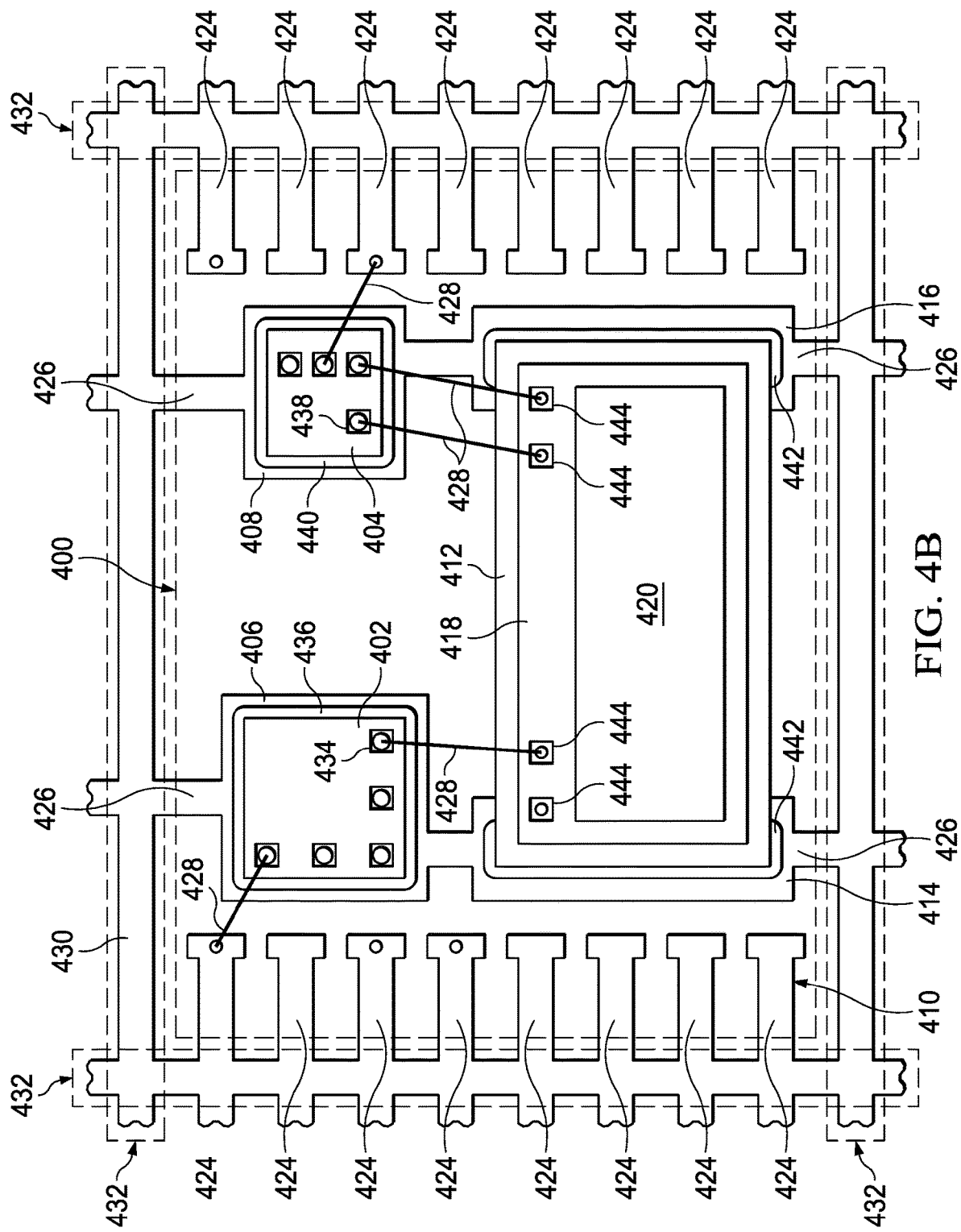

Referring to FIG. 4B, a first die 402 is attached to the first die pad 406. The first die 402 may be implemented as a high voltage integrated circuit, configured to operate at a potential above 100 volts with respect to the ground pin 410 of the microelectronic device 400. The first die 402 may have first bond pads 434 for subsequently-formed wire bonds 428. The first die 402 may be attached to the first die pad 406 by a first attach material 436. In this example, the first attach material 436 is implemented as an electrically non-conductive material, such as an electrically non-conductive adhesive.

A second die 404 is attached to the second die pad 408. The second die 404 may be implemented as a low voltage die, configured to operate at a potential below 10 volts with respect to the ground pin 410. The second die 404 may have second bond pads 438 for the subsequently-formed wire bonds 428. The second die 404 may be attached to the second die pad 408 by a second attach material 440. The second attach material 440 may be implemented as an electrically non-conductive adhesive, an electrically conductive adhesive, or a solder, for example. The second attach material 440 may have a composition that is similar to a composition of the first attach material 436, or may have a composition that is different from the composition of the first attach material 436.

A first magnetically permeable member 412 is attached to the first coupler pad 414 and to the second coupler pad 416. The first magnetically permeable member 412 includes material having a relative magnetic permeability greater than 1, such as an alloy of nickel, iron, or cobalt. The first magnetically permeable member 412 is electrically conductive. The first magnetically permeable member 412 may be free of an electrically insulating coating, which may advantageously reduce a fabrication cost of the microelectronic device 400. The first magnetically permeable member 412 may be attached to the first coupler pad 414 and the second coupler pad 416 with a third attach material 442. The third attach material 442 may have a composition that is similar to the composition of the first attach material 436 or to the composition of the second attach material 440. Alternatively, the third attach material 442 may have a composition that is different from the composition of the first attach material 436 and the composition of the second attach material 440.

A coupler component 418 is attached to the first magnetically permeable member 412. The coupler component 418 may have a laminated structure with layers of electrically insulating material separating transformer windings. The coupler component 418 may be attached to the first magnetically permeable member 412 using an adhesive, a tape, or other attaching material. The coupler component 418 may have third bond pads 444 for the subsequently-formed wire bonds 428.

The wire bonds 428 are formed to electrically connect the first die 402 with one or more of the external leads 424, to electrically connect the second die 404 with one or more of the external leads 424, to electrically connect the first die 402 with the coupler component 418, and to electrically connect the second die 404 with the coupler component 418. The wire bonds 428 may be implemented as round wire bonds using gold, aluminum, or copper bond wire, or may be implemented as ribbon bonds using gold, aluminum, or copper ribbon wire. The wire bonds 428 may be formed using a wire bonds process or a ribbon bonding process, as appropriate. The wire bonds 428 may terminate on the first bond pads 434, the second bond pads 438, and the third bond pads 444, as depicted in FIG. 4B.

A second magnetically permeable member 420 is attached to the coupler component 418, on an opposite side of the coupler component 418 from the first magnetically permeable member 412, so that the coupler component 418 is disposed between the first magnetically permeable member 412 and the second magnetically permeable member 420. The second magnetically permeable member 420 may have a composition similar to a composition of the first magnetically permeable member 412. The second magnetically permeable member 420 may be attached to the coupler component 418 using an adhesive, a tape, or other attaching material. The second magnetically permeable member 420 may be attached to the coupler component 418 using a similar material or process used to attach the coupler component 418 to the first magnetically permeable member 412.

Figure 4C:
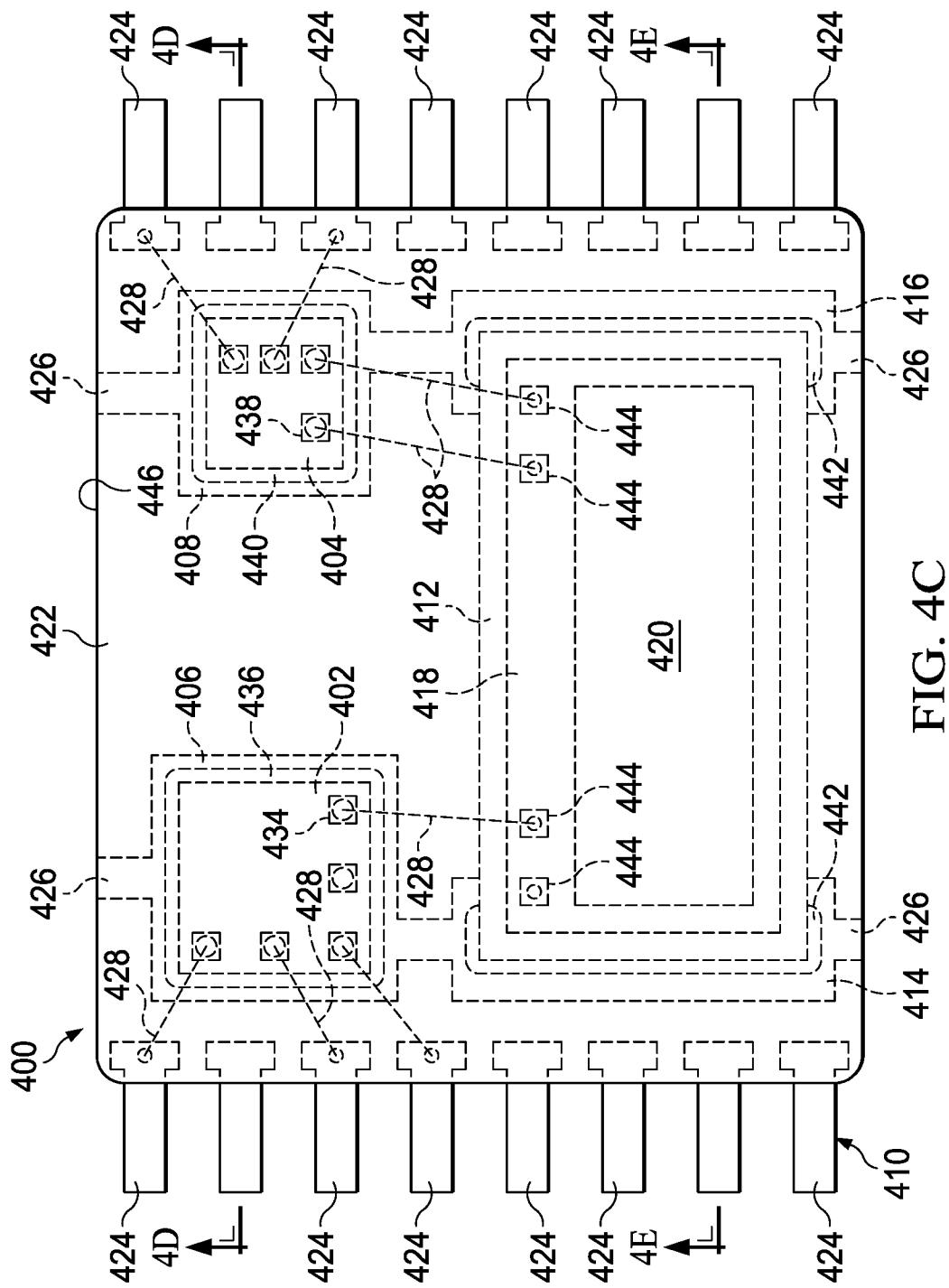

Referring to FIG. 4C, a package structure 422 is formed on the first die 402, the second die 404, the first magnetically permeable member 412, the coupler component 418, and the second magnetically permeable member 420, and extending to the external leads 424 and the support bars 426. The package structure 422 may include epoxy or other resin, for example, and may be formed by injection molding or other packaging process. In this example, the package structure 422 may contain the first die 402, the second die 404, the first magnetically permeable member 412, the coupler component 418, and the second magnetically permeable member 420. The package structure 422 may also contain the first die pad 406, the second die pad 408, the first coupler pad 414, and the second coupler pad 416.

The external leads 424 are separated from the tie bars 432 of FIG. 4B, leaving each external lead 424 extending through an external surface 446 of the package structure 422, so that a portion of each external lead 424 extends from the package structure 422. The support bars 426 are separated from the tie bars 432, leaving the first die pad 406, the second die pad 408, the first coupler pad 414, and the second coupler pad 416 electrically isolated from the external leads 424. The support bars 426 may be separated from the tie bars 432 close to an external surface 446 of the package structure 422, so that the support bars 426 extend past the external surface 446 by a distance less than 250 microns, for example. The support bars 426 may be separated from the tie bars 432 at the external surface 446, as depicted in FIG. 4C. The support bars 426 and the external leads 424 may be separated from the tie bars 432 concurrently, or in separate operations. The support bars 426 and the external leads 424 may be separated from the tie bars 432 by a shearing process, for example.

FIG. 4D is a cross section of the microelectronic device 400 through the first die 402 and the second die 404. The external leads 424 are shaped into a desired configuration, for example, a J-lead configuration, as depicted in FIG. 4D. In this example, the package structure 422 contains at least portions of the first die 402, the second die 404, the first die pad 406, and the second die pad 408.

FIG. 4E is a cross section of the microelectronic device 400 through the first magnetically permeable member 412, the coupler component 418, and the second magnetically permeable member 420. In this example, the package structure 422 surrounds the first magnetically permeable member 412, the coupler component 418, the second magnetically permeable member 420, the first coupler pad 414, and the second coupler pad 416.

Various features of the examples disclosed herein may be combined in other manifestations of example microelectronic devices. For example, the lead frame 230 of FIG. 2A may be used to build a microelectronic device according to the method disclosed in reference to FIG. 3A through FIG. 3F or the method disclosed in reference to FIG. 4A through FIG. 4E. Similarly, the lead frame 330 of FIG. 3A may be used to build a microelectronic device according to the method disclosed in reference to FIG. 2A through FIG. 2J or the method disclosed in reference to FIG. 4A through FIG. 4E. Furthermore, the lead frame 430 of FIG. 4A may be used to build a microelectronic device according to the method disclosed in reference to FIG. 2A through FIG. 2J or the method disclosed in reference to FIG. 3A through FIG. 3F.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

What is claimed is:

1. A microelectronic device, comprising:
   a first die attached to a first die pad, and a second die attached to a second die pad; the first die electrically isolated from the second die;
   a magnetic member attached to a first coupler pad and a second coupler pad;
   a coupler component attached to the magnetic member; the first die and the second die electrically coupled to the coupler component; and
   a package structure covering portions of the first die, the second die, the magnetic member, and the coupler component, wherein the first coupler pad and the second coupler pad are exposed through an external surface of the package structure.

2. The microelectronic device of claim 1, wherein the magnetic member includes material having a relative magnetic permeability greater than 1.

3. The microelectronic device of claim 1, wherein the magnetic member includes an alloy of nickel, iron, or cobalt.

4. The microelectronic device of claim 1, wherein the first coupler pad and the second coupler pad are electrically conductive.

5. The microelectronic device of claim 1, wherein the coupler component includes two or more transformer windings of a transformer.

6. The microelectronic device of claim 1, wherein the coupler component includes a laminated structure with the transformer windings separated by layers of electrically insulating material.

7. The microelectronic device of claim 1, wherein the microelectronic device includes is one a dual-flat no-leads (DFN) package or a quad-flat no-leads (QFN) package.

8. The microelectronic device of claim 1, wherein the first die is a high voltage die and the second die is a low voltage die.

9. The microelectronic device of claim 1, wherein the first die pad and the second die pad are substantially coplanar from a cross-sectional view of the microelectronic device.

10. The microelectronic device of claim 1, wherein the first die and the second die are electrically coupled to some leads of a plurality of leads of the microelectronic device.

11. A microelectronic device, comprising:
a first die attached to a first die pad, and a second die attached to a second die pad;
a magnetic member attached to, a first coupler pad extending from the first die pad, and a second coupler pad extending from the second die pad;
a coupler component attached to the magnetic member;
the first die and the second die electrically coupled to the coupler component; and
a package structure covering portions of the first die, the second die, the magnetic member, and the coupler component.

12. The microelectronic device of claim 11, wherein the first die and the second die are electrically coupled to some leads of a plurality of leads of the microelectronic device.

13. The microelectronic device of claim 11, wherein the first die and the second die are not directly electrically connected to each other.

14. The microelectronic device of claim 11, wherein the first die pad and the second die pad are substantially coplanar from a cross-sectional view of the microelectronic device.

15. The microelectronic device of claim 11, wherein the first die is a high voltage die and the second die is a low voltage die.

* * * * *